United States Patent
Wu

(10) Patent No.: US 7,474,527 B2
(45) Date of Patent: Jan. 6, 2009

(54) DESKTOP PERSONAL COMPUTER AND THERMAL MODULE THEREOF

(75) Inventor: Chih-Wei Wu, Taipei-Hsien (TW)

(73) Assignee: DFI, Inc., Taipei Hsien (TW)

( * ) Notice: Subject to any disclaimer, the term of this patent is extended or adjusted under 35 U.S.C. 154(b) by 0 days.

(21) Appl. No.: 11/858,115

(22) Filed: Sep. 19, 2007

(65) Prior Publication Data

US 2008/0218963 A1    Sep. 11, 2008

(30) Foreign Application Priority Data

Mar. 5, 2007   (TW) .............. 96107472 A
Jun. 1, 2007   (TW) .............. 96119760 A

(51) Int. Cl.
    *H05K 7/20*    (2006.01)
    *F28F 7/00*    (2006.01)
(52) U.S. Cl. .............. 361/687; 165/104.33; 361/695; 361/700; 361/701
(58) Field of Classification Search ............ 165/104.33; 361/687, 700, 701
    See application file for complete search history.

(56) References Cited

U.S. PATENT DOCUMENTS

| | | | |
|---|---|---|---|
| 5,808,869 A * | 9/1998 | Donahoe et al. ............ | 361/704 |
| 5,842,514 A * | 12/1998 | Zapach et al. ........... | 165/104.33 |
| 6,504,719 B2 * | 1/2003 | Konstad et al. ............. | 361/698 |
| 6,778,394 B2 * | 8/2004 | Oikawa et al. ............... | 361/700 |
| 7,277,286 B2 * | 10/2007 | Lee ............................. | 361/700 |
| 7,321,491 B2 * | 1/2008 | Long et al. ................... | 361/687 |
| 2004/0008483 A1 * | 1/2004 | Cheon ......................... | 361/687 |
| 2004/0246677 A1 * | 12/2004 | Chen ........................... | 361/697 |
| 2005/0225942 A1 * | 10/2005 | Lee ............................. | 361/700 |
| 2006/0087811 A1 * | 4/2006 | He .............................. | 361/687 |

* cited by examiner

*Primary Examiner*—Gregory D Thompson
(74) *Attorney, Agent, or Firm*—Jianq Chyun IP Office

(57) ABSTRACT

A thermal module adapted for a desktop personal computer is provided. The desktop personal computer comprises a housing, a power supply, and a motherboard, the power supply being located inside the housing, and including a fan having an outlet oriented toward an outside of the housing, and the motherboard being located inside the housing, and including thereon a plurality of electronic elements. The thermal module comprises a first heat sink, an adjustment device, a first heat pipe, a second heat sink, and a second heat pipe. The first heat sink is disposed on one of the electronic elements. The adjustment device is slidably and thermally connected to the first heat sink by the first heat pipe, and is slidably and thermally connected to the second heat sink, located outside the housing at the outlet of the fan, by the second heat pipe.

12 Claims, 2 Drawing Sheets

DESKTOP PERSONAL COMPUTER AND THERMAL MODULE THEREOF

CROSS-REFERENCE TO RELATED APPLICATION

This application claims the priority benefits of Taiwan applications serial no. 96119760, filed Jun. 1, 2007 and serial no. 96107472, filed Mar. 5, 2007. All disclosures of the Taiwan applications are incorporated herein by reference.

BACKGROUND OF THE INVENTION

1. Field of the Invention

The present invention relates to a desktop personal computer and a thermal module thereof, and more particularly, to a desktop personal computer operable with low noise and a thermal module thereof.

2. Description of Related Art

Current desktop personal computers generally include a motherboard with a plurality of electronic elements mounted thereon. These electronic elements include, for example, a central processing unit (CPU), a pulse width modulator (PWM), and a north bridge chip, which generate a considerable amount of heat during operation, resulting in a rise of the temperature of these electronic elements.

If the heat is not timely removed and thus get accumulated in the electronic elements, the temperature of the electronic elements will continuously rise and exceed over their normal operating temperatures leading to overheating. The overheating may result in a temporary or permanent failure of these electronic elements, and thereby causing operation of the desktop personal computer unstable or even crash of the desktop personal computer. If the temperature of these electronic elements is too high, a permanent failure of the electronic elements may occur.

To lower the temperature of these electronic elements during operation, a plurality of heat sinks are usually disposed on the electronic elements, especially on the CPU, PWM, and north bridge chip. In addition, a plurality of fans may further be attached to these heat sinks, especially to the heat sinks on the CPU and north bridge chip. Thus, cooling efficiency of these heat sinks can be dramatically enhanced by airflows provided by the fans.

As such, the temperature of these electronic elements can be lowered, avoiding the occurrence of temporary or permanent failure. However, the noise, especially the high frequency noise, that the fans generate during operation, may make the user feel uncomfortable.

SUMMARY OF THE INVENTION

The present invention is directed to a thermal module which has low noise and can maintain a satisfactory cooling efficiency.

The present invention is also directed to a desktop personal computer which can operate with low noise and maintain a satisfactory cooling efficiency.

The present invention provides a thermal module adapted for a desktop personal computer. The desktop personal computer comprises a housing, a power supply, and a motherboard, the power supply being located inside the housing, and including a fan having an outlet oriented toward an outside of the housing, and the motherboard being located inside the housing, and including a plurality of electronic elements thereon. The thermal module comprises at least one first heat sink, an adjustment device, at least one first heat pipe, a second heat sink, and at least one second heat pipe. The first heat sink is disposed on the electronic elements, and has a first heat pipe channel extending along a first direction. The adjustment device is located outside the housing, and has at least one second heat pipe channel extending along a second direction that is perpendicular to the first direction, and at least one third heat pipe channel extending along a third direction that is perpendicular to the first direction and the second direction. The first heat pipe includes a first section and a second section, the first second being slidably arranged in the first heat pipe channel along the first direction, and coupled to the first heat sink, and the second section being slidably arranged in the second heat pipe channel along the second direction. The second heat sink is located outside the housing at the outlet of the fan. The second heat pipe includes a third section and a fourth section, the third section being slidably arranged in the third heat pipe channel along the third direction, and coupled to the first heat pipe, and the fourth section being coupled to the second heat sink.

According to one embodiment of the present invention, the thermal module further includes a plurality of the first heat sinks and at least one third heat pipe. The first heat sinks are arranged on the electronic elements, respectively. The third heat pipe interconnects the first heat sinks.

According to one embodiment of the present invention, the first heat sinks are connected in series through a plurality of the third heat pipes.

According to one embodiment of the present invention, the first heat sink is a fin type heat sink.

According to one embodiment of the present invention, the second heat sink is a fin type heat sink.

The present invention further provides a desktop personal computer. The desktop personal computer comprises a housing, a power supply, a motherboard, and a thermal module. The power supply is located inside the housing, and includes a fan having an outlet oriented toward an outside of the housing. The motherboard is located inside the housing, and includes a plurality of electronic elements. The thermal module comprises at least one first heat sink, an adjustment device, at least one first heat pipe, a second heat sink, and at least one second heat pipe. The first heat sinks are disposed on the electronic elements, and have a first heat pipe channel extending along a first direction. The adjustment device is located outside the housing, and has at least one second heat pipe channel extending along a second direction that is perpendicular to the first direction, and at least one third heat pipe channel extending along a third direction that is perpendicular to the first direction and the second direction. The first heat pipe includes a first section and a second section, the first second being slidably arranged in the first heat pipe channel along the first direction, and coupled to the first heat sink, and the second section being slidably arranged in the second heat pipe channel along the second direction. The second heat sink is located outside the housing at the outlet of the fan. The second heat pipe includes a third section and a fourth section, the third section being slidably arranged in the third heat pipe channel along the third direction, and coupled to the first heat pipe, and the fourth section being coupled to the second heat sink.

According to one embodiment of the present invention, the electronic elements comprise a central processing unit, a pulse width modulator, a north bridge chip, and a south bridge chip.

According to one embodiment of the present invention, the first heat sink is arranged over the pulse width modulator.

According to one embodiment of the present invention, the thermal module further includes a plurality of the first heat sinks and at least one third heat pipe. The first heat sinks are arranged on the electronic elements, respectively. The third heat pipe interconnects the first heat sinks.

According to one embodiment of the present invention, the first heat sinks are connected in series through a plurality of the third heat pipes.

According to one embodiment of the present invention, the first heat sink is a fin type heat sink.

According to one embodiment of the present invention, the second heat sink is a fin type heat sink.

The thermal module of the present invention transfers the heat generated by the electronic elements during operation to the outside of the housing, and dissipates the heat by the second heat sink and the fan. As such, the number of the fan used can be reduced while a good cooling result can be maintained. In addition, the thermal module of the present invention can adjust the positions of the second heat sink and the first heat sink by the adjustment device. As such, the position of the second heat sink can be adjusted according to different housings, whereby the thermal module can be employed in different desktop personal computers.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there are illustrated embodiments of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
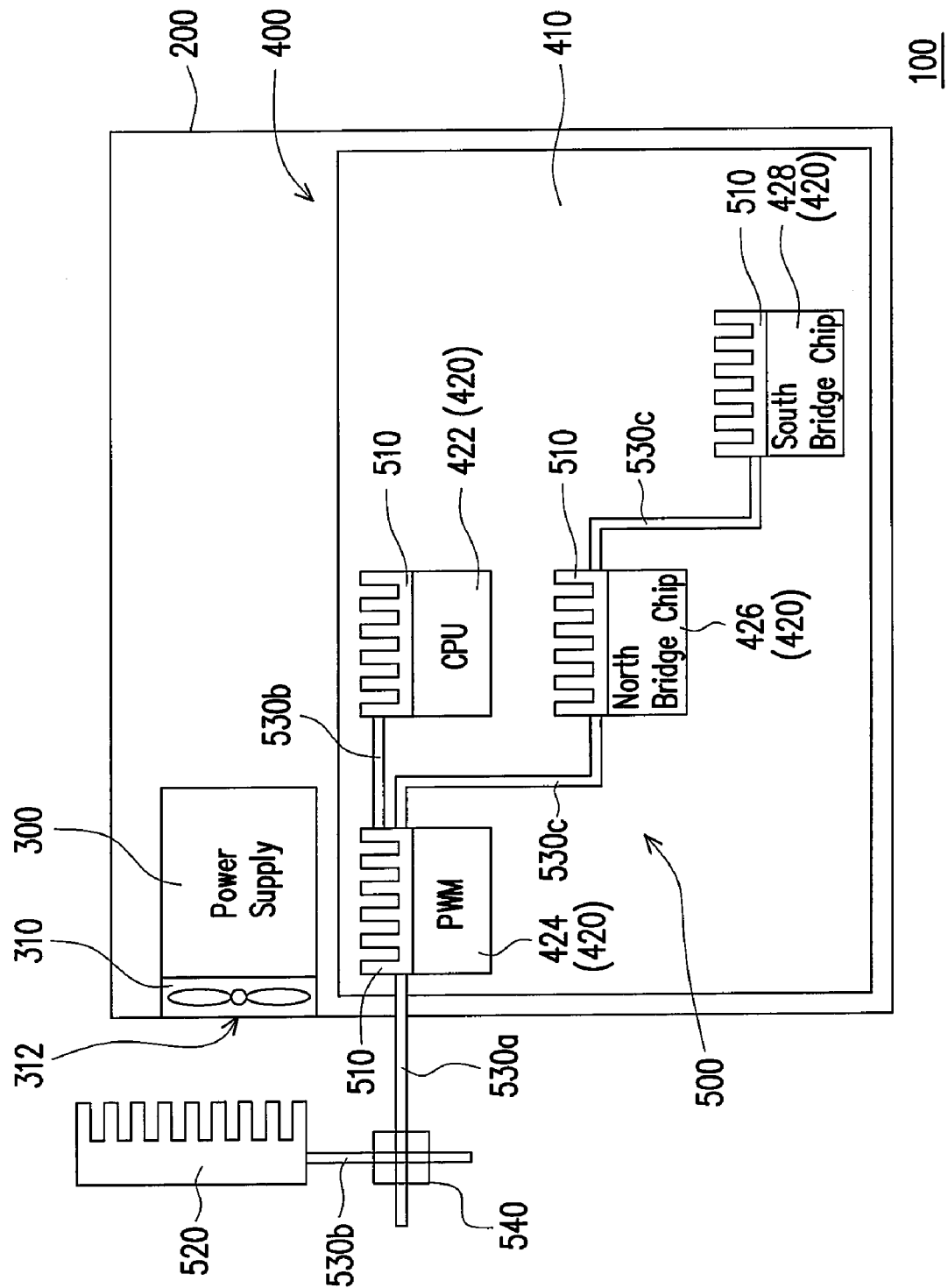
FIG. 1 illustrates a desktop personal computer according to an embodiment of the present invention.
Figure 2:
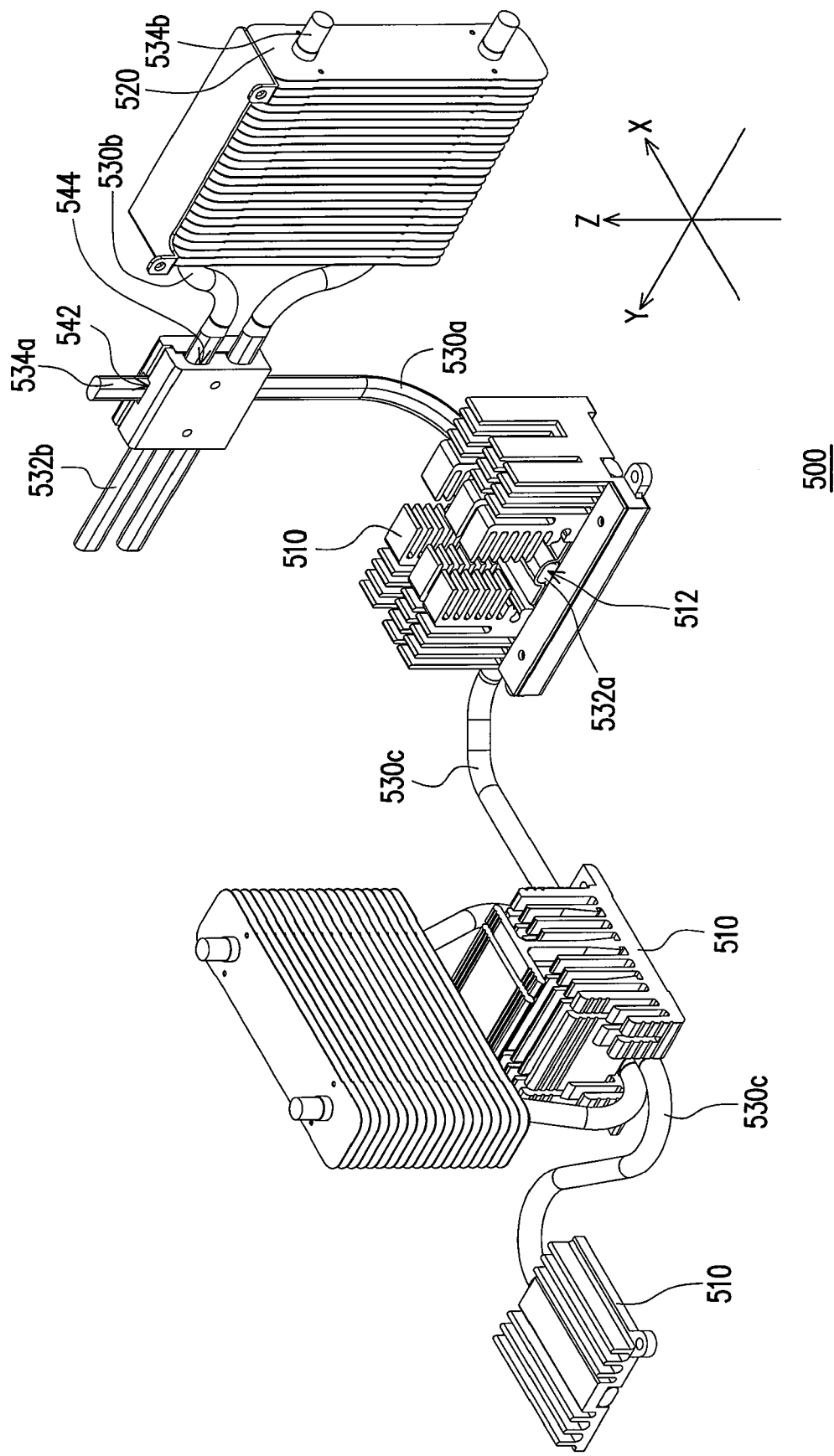
FIG. 2 is a perspective view of a thermal module shown in FIG. 1.

FIG. 1 illustrates a desktop personal computer according to an embodiment of the present invention, and FIG. 2 is a perspective view of a thermal module shown in FIG. 1. Referring to FIGS. 1 and 2, the desktop personal computer 100 includes a housing 200, a power supply 300, a motherboard 400, and a thermal module 500. The power supply 300 includes a fan 310, and is disposed inside the housing 200 with an outlet 312 of the fan 310 oriented toward an outside of the housing 200. The motherboard 400 includes a circuit carrier 410 and a plurality of electronic elements 420 mounted on the circuit carrier 410, and the motherboard 400 is installed inside the housing 200.

The thermal module 500 includes a plurality of first heat sinks 510, a second heat sink 520, and at least one first heat pipe 530a, at least one second heat pipe 530b, and an adjustment device 540. The first heat sinks 510 are, for example, fin type heat sinks, and disposed on the electronic elements 420. The first heat sink 510 has a first heat pipe channel 512 extending along a first direction X. The adjustment device 540 is disposed outside the housing 200, and has a second heat pipe channel 542 extending along a second direction Z, and a third heat pipe channel 544 extending along a third direction Y. The first direction X, the second direction Z, and the third direction Y are perpendicular to each other.

The first heat pipe 530a has a first section 532a and a second section 534a. The first section 532a is slidably received in the first heat pipe channel 512 along the first direction X and coupled to the first heat sink 510, while the second section 534a is slidably received in the second heat pipe channel 542 along the second direction Z. The second heat sink 520 is, for example, a fin type heat sink, and disposed outside the housing 200, at the outlet 312 of the fan 310.

The second heat pipe 530b has a third section 532b and a fourth section 534b. The third section 532b is slidably received in the third heat pipe channel 544 along the third direction Y and coupled to the first heat pipe 530a, while the fourth section 534b is coupled to the second heat sink 520.

Heat generated by the electronic elements 420 during operation is transferred through the first heat pipe 530a and the second heat pipe 530b to the second heat sink 520, and is then dissipated outwards from the second heat sink 520 by airflows provided by the fan 310. For example, the electronic elements 420 may include a CPU 422, a PWM 424, a north bridge chip 426, and a south bridge chip 428. The first heat sink 510 disposed on the PWM 424 is coupled to the second heat sink 520 through the first heat pipe 530a and the second heat pipe 530b.

In this embodiment, in the thermal module 500, heat generated by the electronic elements 420 is transferred to the second heat sink 520 outside the housing 200 by the first heat pipe 530a and the second heat pipe 530b, and the second heat sink 520 is disposed at the outlet 312 of the fan 310, such that the heat is dissipated by the fan 310. As such, the cooling efficiency of the thermal module 500 can be enhanced without setting additional fans, so that the desktop personal computer 100 can stably operate with low noise.

In this embodiment, the thermal module 500 may further include a plurality of third heat pipes 530c. One of the third heat pipes 530c is coupled to two of the first heat sinks 510, such that the heat generated by each of the electronic elements 420 can be transferred to the second heat sink 520, thereby enhancing the cooling efficiency. Specifically, the third heat pipes 530c may be coupled between the first heat sinks 510 disposed on the CPU 422, PWM 424, north bridge chip 426, and south bridge 428, respectively, so that the first heat sinks 510 on these electronic elements 420 are connected in series. As such, these electronic elements 420 can commonly use the second heat sink 520 located at the outlet 312 of the fan 310 to dissipate heat so as to achieve a better heat dissipation result.

Besides, the position of the second heat sink 520 along the first direction X can be adjusted by adjusting the position of the first section 532a in the first heat pipe channel 512, and the position of the second heat sink 520 along the second direction Z can be adjusted by adjusting the position of the second section 534a in the second heat pipe channel 542. In addition, the position of the second heat sink 520 along the third direction Y can be adjusted by adjusting the position of the third section 532b in the third heat pipe channel 544.

In this embodiment, the thermal module 500 can adjust the position of the second heat sink 520 using the adjustment device 540 to dispose the second heat sink 520 at the outlet 312 of the fan 310. As such, when used with different housing 200, the second heat sink 520 can be adjusted to facilitate the mounting of the thermal module 500 on different housing 200. Therefore, the thermal module 500 can be used in different desktop personal computers 100.

In sum, in the thermal module of the present invention, the heat generated by the electronic elements during operation is transferred through the first heat pipe and the second heat pipe to the outside of the housing, and is dissipated by the fan. As such, the cooling efficiency of the thermal module can be enhanced without setting additional fans, so that the desktop personal computer can stably operate with low noise.

In addition, the thermal module of this embodiment can adjust the position of the second heat sink using the adjustment device to dispose the second heat sink at the outlet of the fan. As such, when used with different housing, even if the position of the fan is different, the second heat sink can be adjusted to dispose the second heat sink at the outlet of the fan. Therefore, the thermal module can be mounted on different housings, and thus can be used in different desktop personal computers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thermal module adapted for a desktop personal computer, the desktop personal computer comprising a housing, a power supply, and a motherboard, the power supply being located inside the housing, and including a fan having an outlet oriented toward an outside of the housing, and the motherboard being located inside the housing, and including a plurality of electronic elements thereon, the thermal module comprising:
   at least one first heat sink disposed on one of the electronic elements, the first heat sink having a first heat pipe channel extending along a first direction;
   an adjustment device located outside the housing, the adjustment device having at least one second heat pipe channel extending along a second direction that is perpendicular to the first direction, and at least one third heat pipe channel extending along a third direction that is perpendicular to the first direction and the second direction;
   at least one first heat pipe including a first section and a second section, the first section being slidably arranged in the first heat pipe channel along the first direction, and coupled to the first heat sink, and the second section being slidably arranged in the second heat pipe channel along the second direction;
   a second heat sink located outside the housing at the outlet of the fan; and
   at least one second heat pipe including a third section and a fourth section, the third section being slidably arranged in the third heat pipe channel along the third direction, and coupled to the first heat pipe, and the fourth section being coupled to the second heat sink.

2. The thermal module according to claim 1, further comprising:
   a plurality of the first heat sinks arranged on the other electronic elements, respectively; and
   at least one third heat pipe interconnecting the first heat sinks.

3. The thermal module according to claim 2, wherein the first heat sinks are connected in series through a plurality of the third heat pipes.

4. The thermal module according to claim 1, wherein the first heat sink is a fin type heat sink.

5. The thermal module according to claim 1, wherein the second heat sink is a fin type heat sink.

6. A desktop personal computer comprising:
   a housing;
   a power supply located inside the housing and including a fan having an outlet oriented toward an outside of the housing;
   a motherboard located inside the housing and including a circuit carrier, and a plurality of electronic elements mounted on the circuit carrier;
   a thermal module comprising:
      at least one first heat sink disposed on one of the electronic elements, the first heat sink having a first heat pipe channel extending along a first direction;
      an adjustment device located outside the housing, the adjustment device having at least one second heat pipe channel extending along a second direction that is perpendicular to the first direction, and at least one third heat pipe channel extending along a third direction that is perpendicular to the first direction and the second direction;
      at least one first heat pipe including a first section and a second section, the first section being slidably arranged in the first heat pipe channel along the first direction, and coupled to the first heat sink, and the second section being slidably arranged in the second heat pipe channel along the second direction;
      a second heat sink located outside the housing at the outlet of the fan; and
      at least one second heat pipe including a third section and a fourth section, the third section being slidably arranged in the third heat pipe channel along the third direction, and coupled to the first heat pipe, and the fourth section being coupled to the second heat sink.

7. The desktop personal computer according to claim 6, wherein the electronic elements comprise a central processing unit, a pulse width modulator, a north bridge chip, and a south bridge chip.

8. The desktop personal computer according to claim 7, wherein the first heat sink is arranged over the pulse width modulator.

9. The desktop personal computer according to claim 6, wherein the thermal module further comprises:
   a plurality of the first heat sinks arranged on the other electronic elements, respectively; and
   at least one third heat pipe interconnecting the first heat sinks.

10. The desktop personal computer according to claim 9, wherein the first heat sinks are connected in series through a plurality of the third heat pipes.

11. The desktop personal computer according to claim 6, wherein the first heat sink is a fin type heat sink.

12. The desktop personal computer according to claim 6, wherein the second heat sink is a fin type heat sink.

* * * * *